United States Patent [19]

Stahlhofen

[11] 4,163,672

[45] Aug. 7, 1979

[54] PHOTOSENSITIVE COMPOSITION

[75] Inventor: Paul Stahlhofen, Wiesbaden, Fed. Rep. of Germany

[73] Assignee: Hoechst Aktiengesellschaft, Fed. Rep. of Germany

[21] Appl. No.: 831,819

[22] Filed: Sep. 9, 1977

[30] Foreign Application Priority Data

Sep. 13, 1976 [DE] Fed. Rep. of Germany ....... 2641099

[51] Int. Cl.² .......................... G03C 1/52; G03C 1/68
[52] U.S. Cl. .................................. 96/91 D; 96/91 R; 96/115 R
[58] Field of Search .................. 96/91 R, 91 D, 115 R

[56] References Cited

U.S. PATENT DOCUMENTS

| | | | |
|---|---|---|---|
| 3,046,110 | 7/1962 | Schmidt | 96/91 D |
| 3,046,115 | 7/1962 | Schmidt et al. | 96/91 D |
| 3,046,116 | 7/1962 | Schmidt | 96/91 D |
| 3,890,152 | 6/1975 | Ruckert et al. | 96/91 R |
| 3,929,488 | 12/1975 | Smith | 96/91 R |
| 3,969,118 | 7/1976 | Stahlhofen et al. | 96/91 D |

Primary Examiner—Mary F. Kelley
Attorney, Agent, or Firm—James E. Bryan

[57] ABSTRACT

This invention relates to a photosensitive composition comprising an ester or an amide of an o-naphthoquinone diazide sulfonic or carboxylic acid and, based upon the amount of this compound, about 1 to 50 percent by weight of an organic dye capable of salt formation, and about 5 to 75 percent by weight of a photosensitive halogen-containing diazonium salt which releases acid upon exposure to light and having the general formula I

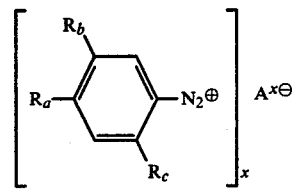

in which $R_a$ is selected from the group consisting of hydrogen, halogen, an alkyl, alkoxy, aryl, arylmercapto, aryloxy, arylamino or benzoylamino group, $R_b$ and/or $R_c$ are selected from the group consisting of hydrogen, an alkyl, alkoxy, aryloxy, alkylmercapto or arylmercapto group, A is selected from the group consisting of $PF_6$, $BF_4$, $AsF_6$, $SbCl_6$, $SnCl_6$, $BiCl_5$, $ZnCl_4$ or $SbF_6$, and x is 1 or 2, with $R_a$ and $R_c$ simultaneously not being hydrogen.

7 Claims, No Drawings

PHOTOSENSITIVE COMPOSITION

This invention relates to a photosensitive composition which contains an o-naphthoquinone diazide compound as the photosensitive substance, as well as a photosensitive acid-releasing, halogen-containing compound and a dye, and which yields a clearly visible image corresponding to the original immediately after exposure to light.

From German Pat. Nos. 854,890, and 938,233, it is, e.g., known to use naphthoquinone-(1,2)-diazide compounds as photosensitive substances for the production of presensitized printing plates. However, such sensitized layers have the disadvantage that the yellow naphthoquinone-(1,2)-diazide layers bleach upon exposure to light to give a faded, yellow light decomposition product, with the result that the layer portions not decomposed by the light (image areas) can be distinguished only with difficulty from the light decomposition products (non-image areas). In practice, this very often leads to defective copies, particularly upon exposure in the so-called step-and-repeat copying machines where one diapositive only is projected several times side by side on the printing plate, e.g., when printing labels. Because the contrast between the image and non-image areas on the printing plate after exposure is poor, particularly when viewed in yellow light, as is necessary in copying rooms for processing photosensitive printing plates, it may, e.g., be very difficult to carry out exact and space-saving registering work.

It already has been proposed to alleviate this drawback, e.g., by the addition of a colored organic indicator dye in homogeneous distribution to the photosensitive layer, which dye changes its color in the pH range between 2.5 and 6.5 (compare German Offenlegungsschrift No. 1,447,011). In U.S. Pat. No. 3,669,658, a different method is disclosed in which o-quinone diazides or naphthoquinone diazides with a leuco dye yield, after exposure, a colored image in the exposed areas. However, these layers have the disadvantage that the obtainable image contrast is insufficient in many cases in practice and that it disappears again upon subsequent development.

In German Offenlegungsschrift No. 2,331,377, copying layers are described which undergo a change of color upon exposure and in which the photosensitive components comprise an o-naphthoquinone diazide-4-sulfonic acid halide, which together with a suitable dye results in a clearly visible and lasting image contrast after exposure to actinic light as well as after development. It is, however, disadvantageous that printing stencils exposed to light after development, which were prepared of printing plates composed of a copying layer of the above-mentioned composition and of certain supports, such as wire-brushed aluminum, result in shorter runs than are obtained with a copying layer which was produced under comparable standard conditions and which does not contain the mentioned additive yielding an image contrast.

It is, therefore, an object of the present invention to provide a light-sensitive copying layer of the above-described kind for the production, e.g., of printing plates, conductor images, screen printing stencils or resists, which layer does not have the disadvantages mentioned and which after exposure under an original, exhibits a reproduction of the original which is richer in contrast than with conventional copying materials of similar kind and, after development with alkaline solutions, remains rich in contrast.

The invention is based on a photosensitive composition comprising an ester or an amide of an o-naphthoquinone diazide sulfonic or carboxylic acid and—based upon the amount of this compound—1 to 50 percent by weight of an organic dye capable of salt formation and 5 to 75 percent by weight of a photosensitive halogen-containing diazonium compound which releases acid when exposed to light. The halogen-containing diazonium compound is a diazonium salt of the general formula I

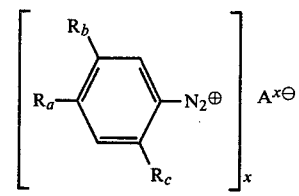

in which
$R_a$ is hydrogen, halogen, an alkyl, alkoxy, aryl, aryloxy, arylamino, arylmercapto or benzoylamino group, which may be substituted,
$R_b$ and/or $R_c$ are hydrogen, an alkyl, alkylmercapto, or alkoxy group, with alkyl being a saturated hydrocarbon radical having from 1 to 3 carbon atoms, or an aryloxy or arylmercapto group which may be substituted,
A is $PF_6$, $BF_4$, $AsF_6$, $SbCl_6$, $SnCl_6$, $BiCl_5$, $ZnCl_4$ or $SbF_6$, and
x is 1 or 2,
with $R_a$ and $R_c$ simultaneously not being hydrogen.

In a preferred embodiment, the copying layer contains 10 to 40 percent by weight of diazonium salt and 3 to 30 percent by weight of a dye, based upon the weight of o-naphthoquinone diazide.

It may be assumed that the diazonium salt present in the photosensitive composition according to the invention is photolytically split upon exposure to light and reacts in a subsequent reaction with the dye to effect a change of color so that, after exposure to actinic light, a marked contrast between the exposed and unexposed image areas is obtained. Further, the colored areas not struck by light resistant to the developer to be used so that even after development a colored reproduction of the original with a strong contrast is maintained.

As diazonium salts of the general formula I the compounds known in diazo printing which have a utilizable absorption between 300 and 600 nm may be used.

Examples of diazonium salts which are well suited for use in the inventive copying layer as part of the photosensitive, acid-releasing compound are:
4-alkoxy-benzene,
4-chloro-2,5-dialkoxy-benzene,
4-benzoylamino-benzene,
4-benzoylamino-2,5-dialkoxy-benzene,
4-arylamino-benzene,
4-alkylmercapto-benzene,
4-arylmercapto-benzene,
4-alkylmercapto-2,5-dialkoxy-benzene, and
4-aryloxy-2,5-dialkoxy-benzene diazonium salts.

Some diazonium compounds which have proven reliable and which have an adequate shelf life, as known from experience, are mentioned in the examples; they are preferably used in the form of their salts soluble in organic solvents, particularly their salts with complex acids, such as tetrafluoroborate, hexafluorophosphate or hexafluoroarsenate.

The particularly suitable compounds are characterized by the fact that in the general formula $R_a$ stands for an arylmercapto, benzoylamino or alkoxyphenyl group, $R_b$ and $R_c$ stand for an alkoxy group, in particular an ethoxy group, and A stands for $PF_6$, $BF_4$, or $AsF_6$.

Suitable dyes for use in the invention are, among others, especially basic dyes from the group of triphenyl methanes, i.e., dyes which are derived from triphenylmethane by substitution of the phenyl group by $NH_2$ groups, OH groups, $HSO_3$ groups or other groups or atoms, or from the group of azines, e.g., phenazines, oxazines or dyes from the group of the anthraquinones, i.e. dyes which are derived from anthraquinone, with the chromophoric groups being $>C=O$ and $>C=C<$, e.g., Crystal Violet (42,555), Methyl Violet 2B (42,535), Malachite Green (42,000), fuchsine (42,510), Crystal Violet carbinol base (42,555:1), para-fuchsine (42,500), Sudan Blue G (61,520), Acilan Brilliant Blue 5 B (42,740), Acilan Violet S 4 BN (42,640), Astradiamond Green GX (42,040), Rhodamine B (45,170), Samaron Blue GSL (62,500), Victoria Blue B (44,045), Alizarine Direct Blue (62,055), Victoria Pure Blue BOD (42,595), Brilliant Green (42,040), Nile Blue BX (51,185), Neutral Red (50,040) and Rhoduline Pure Blue 3 G (51,004).

The numbers in brackets indicate the C.I constitution number used in the five-volume work "Colour Index", Third Edition, (1971, London) for identifying the dyes. The desired imagewise color contrast of the exposed layer is most distinct when the dye contained therein is red, blue or green. Such dyes are, therefore, preferably used.

The photosensitive substance contained in the copying layers is composed of one or several of the above-mentioned quinone diazide compounds. The preparation of these compounds e.g., described in German Pat. Nos. 854,890; 865,109; 879,203; 894,959; 938,233; 1,109,521; 1,114,705; 1,118,606; 1,120,273; 1,124,817; and 1,543,721.

The copying layers of the invention may contain conventional additives, e.g., resins and plasticizers, usually present in light-sensitive layers. The resin content may be considerable and may amount, for example, to several hundred percent of the total content of the o-naphthoquinone diazide compounds. Generally, resins are preferred which are soluble in aqueous-alkaline solutions, in particular novolaks.

As copying layer supports there may be used those conventional for the reproduction methods concerned, e.g. metal plates or foils such as aluminum or zinc, with correspondingly pretreated surfaces; multi-metal plates, e.g. chromium/copper, chromium/copper/aluminum, chromium/copper/zinc; or paper, plastic films, fabrics suitable for screen printing, or metallized plates of insulating material.

The composition of the invention makes it possible to maintain in the positive-working copying layers, which have proven their reliability for years, by exposure a distinct color change in the exposed areas, although the copying layer has a full inherent color due to the dye contained therein, and thus to obtain an image rich in contrast which, even under yellow illumination, distinctly contrasts with the unexposed areas.

Even after removal of the exposed parts with an alkaline developer, a stencil rich in contrast is formed which corresponds to the original. Film edges and register marks also copied which normally must be removed or corrected after development thus become more distinctly visible. There is thus no need to dye copied film edges to make them more readily visible.

A further advantage of the copying layers prepared according to the invention is their excellent shelf life even under extreme, e.g. tropical conditions, as well as the consistency of runs even when printing stencils are used which may have been exposed to light after development. The halogen-containing compounds used as intended in the invention, which release acid when exposed to light are relatively stable compounds, as is shown by their classification in dangerous-materials class III (inflammable materials) of Annex C of "Eisenbahnverkehrsordnung" (Railway Traffic Regulations of Deutsche Bundesbahn), and they have, therefore, a wider range of application then some of the compounds hitherto used for that purpose.

The invention will be further illustrated by reference to the following examples in which one part by volume is 1 ml when one part by weight is 1 g.

EXAMPLE 1

0.6 part by weight of the esterification product of 1 mole of 2,3,4-trihydroxy-benzophenone and 3 moles of the chloride of naphthoquinone-(1,2)-diazide-(2)-5-sulfonic acid, 0.4 part by weight of the esterification product of 1 mole of 2,2'-dihydroxy-dinaphthyl-(1,1')-methane and 2 moles of the chloride of naphthoquinone-(1,2)-diazide-(2)-5-sulfonic acid, 6.45 parts by weight of a cresol-formaldehyde novolak (softening range according to the capillary method, DIN 53,181: 105° to 120° C., 0.13 part by weight of Crystal Violet (C.I. No. 42,555) and 0.30 part by weight of 4-(p-tolylmercapto)-2,5-diethoxybenzene diazonium hexafluorophosphate are dissolved in a solvent mixture composed of:

80 parts by volume of ethylene glycol monomethyl ether and 15 parts by volume of butyl acetate.

An aluminum foil roughened by brushing is coated with this solution.

The photosensitive printing plate thus obtained has an intensely dark-blue-colored copying layer. After exposure to light under a diapositive, the unexposed areas of the layer remain intensely blue colored, whereas the exposed areas of the layer are only faintly colored or almost colorless. The image of the original thus can be seen with such good contrast that it can be distinctly recognized in all details even in yellow light.

For the production of a printing form, the exposed printing plate is developed in the usual manner with a solution of 5.3 parts by weight of sodium metasilicate.9 $H_2O$ 3.4 parts by weight of sodium orthophosphate.12 $H_2O$ 0.3 part by weight of sodium dihydrogen phosphate (anhydrous) in 91 parts by volume of water, so that the exposed layer areas are removed. The remaining unexposed layer areas remain visible with good contrast with respect to the colorless background.

The procedure in the following Examples 2 to 8 is similar to that in the above Example 1 and, after exposure of the obtained photosensitive printing plates, similar results are obtained with respect to image contrast prior to and also after development. In the following examples, therefore, in most cases only the ingredients of the coating solutions and the kind of support used are indicated, and only occasionally additional brief remarks are added.

EXAMPLE 2

Coating solution:
1.20 parts by weight of the esterification product of 1 mole of 2,4-dihydroxy-benzophenone and 2 moles of the chloride of naphthoquinone-(1,2)-diazide-(2)-5-sulfonic acid,
0.70 part by weight of the esterification product of 1 mole of 2,2'-dihydroxy-dinaphthyl-(1,1')-methane and 2 moles of the chloride of naphthoquinone-(1,2)-diazide-(2)-5-sulfonic acid,
4.80 parts by weight of a phenol-formaldehyde novolak (content of OH groups: 14 percent by weight), (softening range according to the capillary method, DIN 53,181: 110° to 120° C.),
0.20 part by weight of polyvinyl butyral,
0.15 part by weight of Astradiamond Green GX (C.I. No. 42,040),
0.30 part by weight of 4-(p-tolylmercapto)-2,5-diethoxy-benzene diazonium hexafluorophosphate and
95 parts by volume of the solvent mixture as in Example 1.

Copying layer support: chrome-plated aluminum sheet.

EXAMPLE 3

Coating solution:
0.60 part by weight of the esterification product of 1 mole of 2,4-dihydroxy-benzophenone and 2 moles of the chloride of naphthoquinone-(1,2)-diazide-(2)-5-sulfonic acid,
0.40 part by weight of the esterification product of 1 mole of 2,2'-dihydroxy-dinaphthyl-(1,1')-methane and 2 moles of the chloride of naphthoquinone-(1,2)-diazide-(2)-5-sulfonic acid,
6.40 parts by weight of novolak (as in Example 1),
0.15 part by weight of Samaron Blue GSL (C.I. No. 62,500),
0.40 part by weight of 4-(p-tolylmercapto)-2,5-diethoxy-benzene diazonium tetrafluoroborate and
95 parts by volume of the solvent mixture as in Example 1.

Copying layer support: aluminum foil roughened by brushing.

EXAMPLE 4

Coating solution:
0.90 part by weight of the p-cumylphenol ester of naphthoquinone-(1,2)-diazide-(2)-4-sulfonic acid,
1.00 part by weight of the esterification product of 1 mole of 2,2'-dihydroxy-dinaphthyl-(1,1')-methane and 2 moles of the chloride of naphthoquinone-(1,2)-diazide-(2)-5-sulfonic acid,
5.00 parts by weight of novolak (as in Example 2),
0.20 part by weight of polyvinyl butyral,
0.15 part by weight of Brilliant Green (C.I. No. 42,040),
0.30 part by weight of 4-benzoylamino-2,5-diethoxy-benzene diazonium hexafluorophosphate, and
95 parts by volume of the solvent mixture as in Example 1.

Copying layer support: aluminum foil roughened by brushing.

EXAMPLE 5

Coating solution:
0.90 part by weight of the esterification product of 1 mole of 2,3,4-trihydroxy-benzophenone and 3 moles of the chloride of naphthoquinone-(1,2)-diazide-(2)-5-sulfonic acid,
0.60 part by weight of the esterification product of 1 mole of 2,2'-dihydroxy-dinaphthyl-(1,1')-methane and 2 moles of the chloride of naphthoquinone-(1,2)-diazide-(2)-5-sulfonic acid,
5.40 parts by weight of novolak (as in Example 1),
0.05 part by weight of Crystal Violet base (C.I. No. 42,555:1),
0.15 part by weight of 4-(4'-ethoxy-phenyl)-2,5-diethoxy-benzene diazonium hexafluorophosphate,
0.50 part by weight of phosphoric acid tri-($\beta$-chloroethyl)-ester, and
95 parts by volume of the solvent mixture as in Example 1.

Copying layer support: electrolytically roughened and anodized aluminum foil.

EXAMPLE 6

Coating solution:
0.90 part by weight of the esterification product of 1 mole of 2,3,4-trihydroxy-benzophenone and 3 moles of the chloride of naphthoquinone-(1,2)-diazide-(2)-5-sulfonic acid,
0.70 part by weight of the esterification product of 1 mole of 2,2'-dihydroxy-dinaphthyl-(1,1')-methane and 2 moles of the chloride of naphthoquinone-(1,2)-diazide-(2)-5-sulfonic acid,
5.30 parts by weight of novolak (as in Example 1),
0.08 part by weight of Victoria Blue B (C.I. No. 44,045),
0.30 part by weight of 4-(p-tolylmercapto)-2,5-diethoxy-benzene diazonium tetrafluoroborate,
0.50 part by weight of phosphoric acid tri-($\beta$-chloroethyl)-ester and
95 parts by volume of the solvent mixture as in Example 1.

Copying layer support: electrolytically roughened and anodized aluminum foil.

EXAMPLE 7

Coating solution:
0.60 part by weight of the esterification product of 1 mole of 2,3,4-trihydroxy-benzophenone and 3 moles of the chloride of naphthoquinone-(1,2)-diazide-(2)-5-sulfonic acid,
0.40 part by weight of the esterification product of 1 mole of 2,2'-dihydroxy-dinaphthyl-(1,1')-methane and 2 moles of the chloride of naphthoquinone-(1,2)-diazide-(2)-5-sulfonic acid,
6.45 parts by weight of cresol-formaldehyde novolak (as in Example 1),
0.14 part by weight of Crystal Violet base (C.I. No. 42,555:1),
0.35 part by weight of 4-(p-tolylmercapto)-2,5-diethoxy-benzene diazonium hexafluoroarsenate,
95 parts by volume of the solvent mixture as in Example 1.

Copying layer support: aluminum foil roughened by brushing.

EXAMPLE 8

This example describes a copying layer solution which may be used as a positive photoresist composition for various purposes, particularly for the preparation of etch resists, e.g., for etching shaped articles and signboards and in the production of conductor images, particularly also in microelectronics. The solution has a long shelf life. The type of coating and the layer thickness may be adapted within wide limits to the respective requirements. After exposure to light, the exposed areas appear in good contrast with respect to the unexposed areas. The exposed areas may be easily removed with an alkaline developer (pH about 12.8).

Coating solution:
1.5 parts by weight of the esterification product of 1 mole of 2,3,4-trihydroxy-benzophenone and 2 moles of the chloride of naphthoquinone-(1,2)-diazide-(2)-5-sulfonic acid,
0.4 part by weight of 4-(p-tolylmercapto)-2,5-diethoxy-benzene diazonium hexafluorophosphate,
0.1 part by weight of Crystal Violet (C.I. No. 42,555),
10.0 parts by weight of a phenol formaldehyde novolak (as in Example 2),
2.0 parts by weight of epoxy resin (Epikote ® 1001),
40 parts by volume of ethylene glycol monomethyl ether,
50 parts by volume of tetrahydrofuran, and
10 parts by volume of butyl acetate.

A plate of insulating material laminated with a copper foil of 35 μ thickness (Kupfer-Pertinax ®) is coated with this solution.

Table

Color changes on exposure of the copying layers according to the invention:

| Example No. | Color | |
|---|---|---|
| | Unexposed | Exposed |
| 1 | dark blue | light green |
| 2 | dark green | light violet |
| 3 | green | light blue |
| 4 | green | light yellow |
| 5 | dark green | light blue |
| 6 | green | light blue |
| 7 | dark blue | light blue |
| 8 | dark green | blue |

It will be obvious to those skilled in the art that many modifications may be made within the scope of the present invention without departing from the spirit thereof, and the invention includes all such modifications.

What is claimed is:
1. A photosensitive composition comprising an ester or an amide of an o-naphthoquinone diazide sulfonic or carboxylic acid and, based upon the amount of this compound, about 1 to 50 percent by weight of an organic dye capable of salt formation and being selected from the group consisting of a triphenylmethane, azine, or anthraquinone dye, and about 5 to 75 percent by weight of a photosensitive halogen-containing diazonium salt which releases acid upon exposure to light and having the general formula I

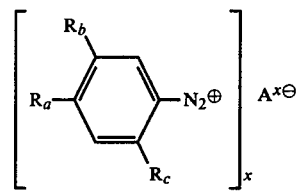

in which
$R_a$ is selected from the group consisting of hydrogen and halogen atoms, alkyl, alkoxy, aryl, arylmercapto, aryloxy, arylamino and benzoylamino groups,
$R_b$ and $R_c$ are selected from the group consisting of hydrogen atoms, alkyl, alkoxy, aryloxy, alkylmercapto and arylmercapto groups,
A is selected from the group consisting of $PF_6$, $BF_4$, $AsF_6$, $SbCl_6$, $SnCl_6$, $BiCl_5$, $ZnCl_4$ and $SbF_6$, and
x is 1 or 2,
with $R_a$ and $R_c$ simultaneously not being hydrogen.

2. A composition in accordance with claim 1 including 10 to 40 percent by weight of diazonium salt and 3 to 30 percent by weight of dye, based on the weight of the naphthoquinone diazide compound.

3. A composition in accordance with claim 1 in which the dye is red, blue or green.

4. A composition in accordance with claim 1 in which in the general formula I
$R_a$ is selected from the group consisting of arylmercapto, benzoylamino and alkoxyphenyl groups
$R_b$ and $R_c$ are alkoxy groups and
A is selected from the group consisting of $PF_6$, $BF_4$ and $AsF_6$.

5. A composition in accordance with claim 1 in which $R_b$ and $R_c$ are ethoxy groups.

6. A composition in accordance with claim 1 further containing a resin which is soluble or swellable in aqueous alkaline solutions.

7. A composition in accordance with claim 6 in which the resin is a novolak.

* * * * *

UNITED STATES PATENT OFFICE
CERTIFICATE OF CORRECTION

Patent No. 4,163,672  Dated August 7, 1979

Inventor(s) Paul Stahlhofen

It is certified that error appears in the above-identified patent and that said Letters Patent are hereby corrected as shown below:

Column 2, line 47, after "light" the word - - - are - - - has been omitted.

Column 3, line 19, $>C=\overline{\underline{O}}$ should read - - - $>C=\overline{\underline{O}}$ - - -.

Column 3, line 20, " $>C=C<$ " should read - - - $>C=C<$ - - -.

Column 3, line 41, after "compounds" the word - - - is - - - has been omitted.

Column 8, line 1 of claim 5, "claim 1" should read - - - claim 4 - - -.

Signed and Sealed this

*Thirteenth* Day of *November 1979*

[SEAL]

Attest:

RUTH C. MASON
*Attesting Officer*

LUTRELLE F. PARKER
*Acting Commissioner of Patents and Trademarks*